United States Patent [19]
Lo et al.

[11] Patent Number: 5,264,793
[45] Date of Patent: Nov. 23, 1993

[54] SPLIT ARRAY DIPOLE MOMENT DETECTION AND LOCALIZATION

[75] Inventors: Allen K. Lo, Diamond Bar; Wilbur W. Eaton, Jr., Placentia, both of Calif.

[73] Assignee: Hughes Aircraft Company, Los Angeles, Calif.

[21] Appl. No.: 684,521

[22] Filed: Apr. 11, 1991

[51] Int. Cl.$^5$ .................................................. G01B 7/00
[52] U.S. Cl. .......................... 324/207.13; 324/207.22; 324/207.23; 324/244; 324/260; 364/556; 364/561
[58] Field of Search .................. 324/207.13, 207.14, 324/207.22, 207.23, 207.26, 244, 260; 364/550, 556, 561, 571.02

[56] References Cited

U.S. PATENT DOCUMENTS

| | | | |
|---|---|---|---|
| 4,600,883 | 7/1986 | Egli et al. | 324/207.26 |
| 4,710,708 | 12/1987 | Rorden et al. | 324/207.26 |

Primary Examiner—Bernarr E. Gregory
Attorney, Agent, or Firm—Wanda K. Denson-Low

[57] ABSTRACT

A dipole moment detection and localization process and apparatus in which the processing is applied to a single linear array adapted to sense magnetic dipoles, and wherein data from the sensors are processed as if it were derived from sets of subarrays of sensors. The apparatus comprises a linear sensor array whose output is processed by separate dipole moment detection and location processors, or a single processor that provides for parallel processing operation. Data from the plurality of subarrays of sensors are processed in terms of Anderson functions and are correlated. The individual outputs of each processor, or parallel processing portion, is coupled to a multiplier that is adapted to correlate the signals. The dot product of these two correlated output signals is then formed to yield data that is thresholded and displayed.

6 Claims, 5 Drawing Sheets

SPLIT ARRAY DIPOLE MOMENT DETECTION AND LOCALIZATION

BACKGROUND

The present invention relates generally to dipole moment detection and localization, and more particularly, to split array dipole moment detection and localization apparatus and methods for detecting surface and subsurface vessels.

Reference is made to U.S. Patent Application Ser. No. 07/616,158, filed Nov. 20, 1990, for "Dipole Moment Detection and Localization," assigned to the assignee of the present invention, the contents of which is incorporated herein by reference. The dipole moment detection and localization process described in this patent application has been demonstrated to yield dramatic performance improvement over currently available magnetic anomaly detection systems using a single sensor to detect a change in the local magnetic field. This dipole moment detection and localization process uses an array or multiple arrays of magnetic sensors and digital signal processing techniques to process the magnetic field's x, y, and z components for vector sensors and the total field component for scalar sensors at each of a plurality of positions relative to the array of sensors. In doing this, a magnetic signature of the magnetic field of a magnetic dipole located in the field is created. This magnetic signature provides an easily recognizable feature for an automatic pattern recognizing system. This process precomputes predicted target magnetic signatures for multiple orientations of the dipole at each of a plurality of range locations, and store them in a lookup table for magnetic signature matching.

Input data comprising the magnetic field strengths measured by the sensors are processed against a predicted background ambient noise using a linear model, where each sensor's output value is predicted using other sensors of the array, and a long term time average consistent with the relative motion of a target. This amounts to bandpass filtering or long term averaging of the signals from the sensor array. The bandpass filtered data is used to update the predicted data so that anomalies and other non-target data are removed from the signals that are processed. The sensor data is then processed against a set of Anderson adjoint matrices, which are a set of mathematical functions (Anderson functions) that decompose the magnetic field into its components in each of the maximum response locations for each dipole orientation.

The resulting data is expressed in terms of sensed Anderson coefficients and this data is matched filtered, wherein it is mathematically correlated by means of a dot product with a set of stored precomputed predicted target signatures (precomputed Anderson coefficients). The dot product, or correlation, of these two set of data yields a set of values including the largest value indicating a magnetic signature matches in the set of correlated data. The data is then normalized. This normalized data is then thresholded, and if a target is present at any one of the maximum response locations, then the correlated, dot product, normalized value computed as stated above will be higher than the chosen threshold.

Notwithstanding the benefits provided by the above-cited invention, it has been found that improved performance can be had by modifying its processing steps.

SUMMARY OF THE INVENTION

The basic concept of the present invention is to extend the dipole moment detection and localization process disclosed in the above-cited patent application to improve its performance. In the original dipole moment detection and localization process cited above, the processing is applied over an entire linear sensor array or linear sensor arrays. In the present invention, the processing is applied to a plurality of subarrays of the single linear sensor array. The processing used in the prior invention is performed on the data from each of the subarrays. The outputs of the processing performed by the prior invention are then gross correlated together to form the final process output.

Similar to the original dipole moment detection and localization process, the split array process is used to detect and localize surface and sub-surface ocean going vessels for portal defense applications. The split array dipole moment detection and localization process further enhances the performance characteristics without requiring additional resources. An advantage of this split array dipole moment detection and localization process is that it can provide detection and localization of a dipole with less ambiguity, and hence provides a performance improvement over the original concept, utilizing the same number of magnetic sensors and processing resources.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Dipole moment detection and localization in accordance with the present invention uses an array of magnetic sensors and digital signal processing to process a magnetic field into x, y, and z components for vector sensors, and its total field component for scalar sensors, at each of a plurality of positions relative to the array of sensors. In doing this, a magnetic signature of a magnetic dipole located in the field is created. This magnetic signature provides an easily recognizable feature for an automatic pattern recognizing system.

Figure 1:
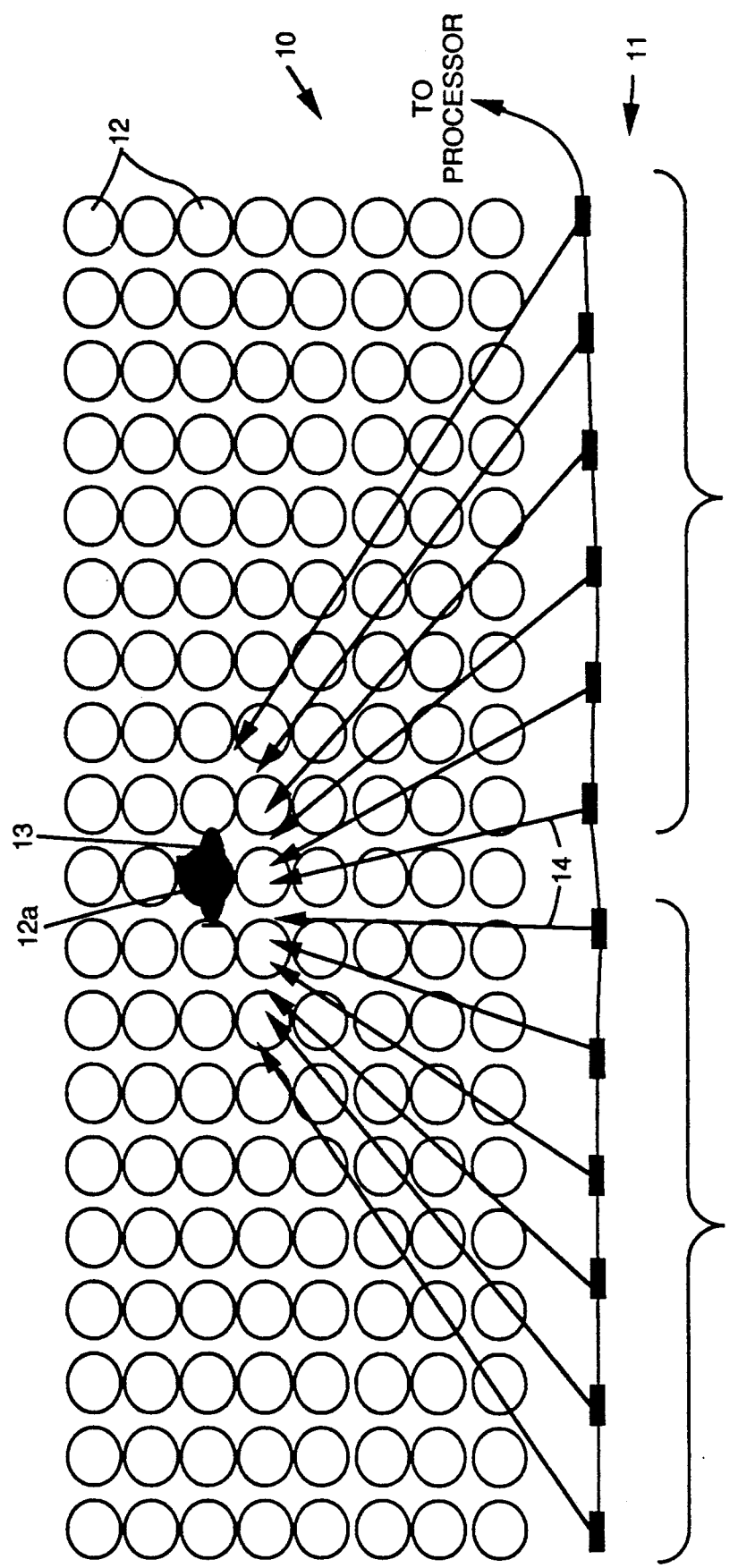
FIG. 1 is a diagram illustrating the concepts of the method and apparatus of the present invention.
Figure 2:
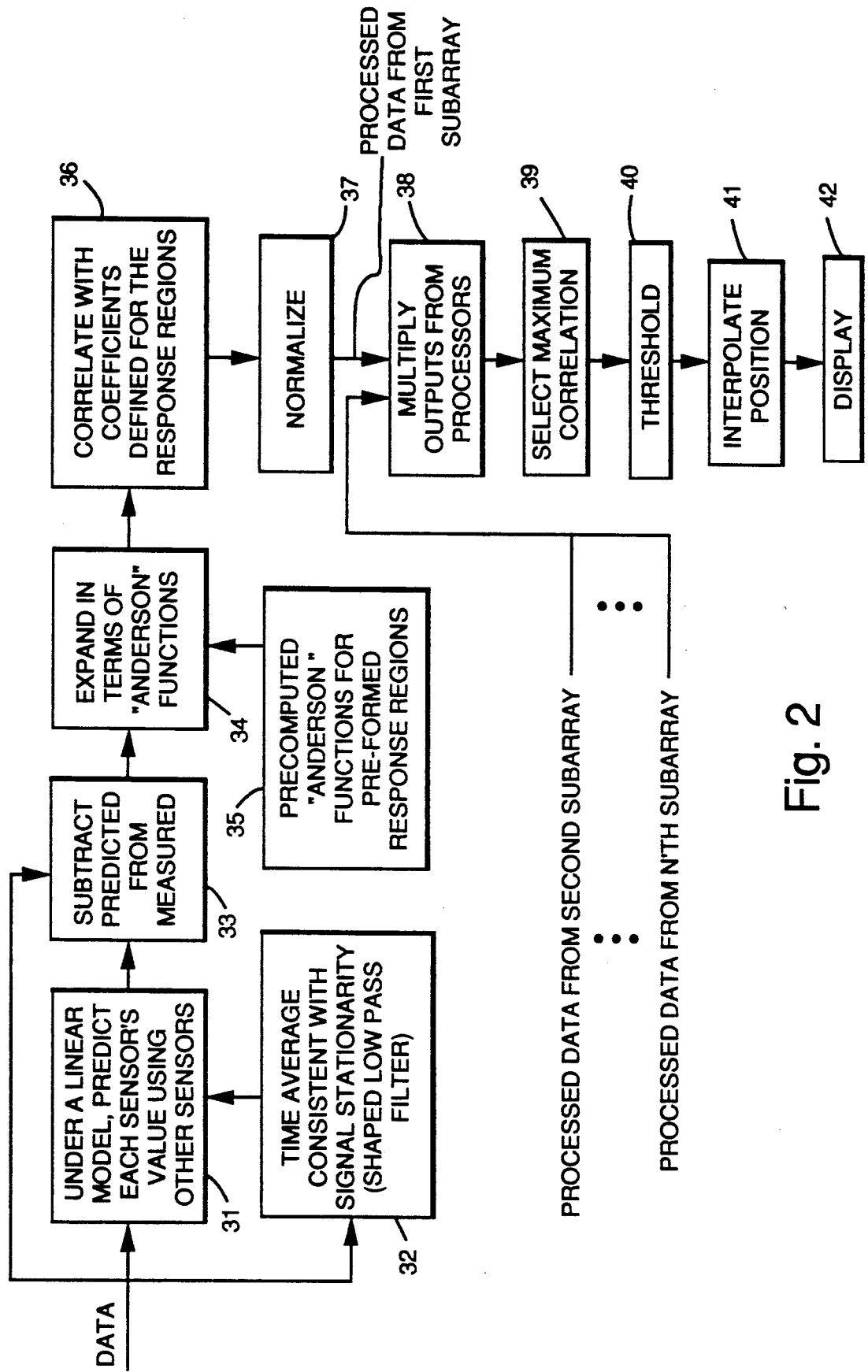
FIG. 2 is a block diagram illustrating the processing flow using the method and apparatus of the present invention.

FIG. 1 is a diagram illustrating the concepts of the method and apparatus of the present invention. In particular, FIG. 1 shows a portion of detection and localization system 10 which includes two subarrays of magnetic sensors 11a, 11b that are part of a single linear sensor array 11. The sensor array 11 is coupled to a processor that separately process the individual outputs of the subarrays 11a, 11b. The processing steps of the processor are shown in FIG. 2. In essence, the data from the sensor array 11 is distributively processed as though the data was derived from separate subarrays 11a, 11b. The array of circular locations represent maximum response locations 12 that are defined relative to the sensor arrays 11. The maximum response locations 12 have a set of precomputed magnetic responses associated therewith which represent the Anderson function representative of the magnetic field that would result if a magnetic dipole were present within each particular maximum response location 12 at a plurality of different orientations. Also shown in FIG. 1 is a particular maximum response location 12a (highlighted) in which is located a magnetic dipole 13, represented by the submarine. Also a plurality of arrows representing magnetic vectors 14 which would constitute the sensed magnetic signature are shown extending from each sensor of the plurality of subarrays of magnetic sensors 11a, 11b toward the particular maximum response location 12a in which the magnetic dipole 13 is located. Each sensor's reading contributes a plurality of sets of vectors derived from the plurality of subarrays of sensors 11a, 11b that is indicative of the location of the magnetic dipole 13, thereby forming a sensed signature that is processed using the concepts of the present invention as described below.

Referring to FIG. 2, it shows a block diagram illustrating the processing steps utilized in the method and apparatus of the present invention. FIG. 2 shows the processing steps performed within the processor of the present invention that is associated with processing of data from each of the sensor subarrays 11a, 11b. As shown in FIG. 2, in a first processing step 31, data from one subarray of sensors 11a, for example, is processed using a linear model to predict each sensor's value using the other sensors. In addition, in a second processing step 32, the data is time averaged to perform a long term integration thereof which operates as a low pass filter on the data. This data is used to adjust the values of the data computed in the first processing step 31. Furthermore, in a third processing step 33, the predicted sensor data value, as modified by the time averaged data, is subtracted from the measured data data. The resultant data is processed against the set of stored Anderson functions in step 34. Prior to operational use of the present invention, and as is indicated in process step 35, stored data is generated in terms of the Anderson functions which comprise magnetic responses associated with each of the maximum response locations 12 that represent the magnetic field that would result if a magnetic dipole were present within each particular maximum response location 12. The processing results in a set of measured Anderson coefficients.

The measured Anderson coefficients are then matched filtered (correlated) against a precomputed set of Anderson coefficients comprising the set of magnetic signatures for a plurality of orientations at any one of the magnetic response location in processing step 36. This correlation comprises a dot product of the two sets of data, and the correlation produces sharply increased normalized values when the two data values are substantially the same, while producing relatively low values when the data is only moderately different. The correlated values of the processor is then normalized in step 37. Alternatively, the correlated values of each of respective processors may be normalized, depending upon whether a single or multiple processors are employed to perform the processing. Then, the normalized magnetic response location outputs of the respective processors are multiplied together (dot product) in step 38 to form a processor output. A maximum, or peak, correlated value is selected in processing step 39. A threshold is then selected in step 40, say for example, 50% of the peak normalized, correlated value. Correlated and normalized signals above the threshold are displayed by interpolating the relative positions (locations) of the maximum response location and displaying them on a monitor, as is illustrated in steps 41 and 42. A more detailed understanding of this processing will be had from a reading of the above-referenced patent application.

Figure 3:
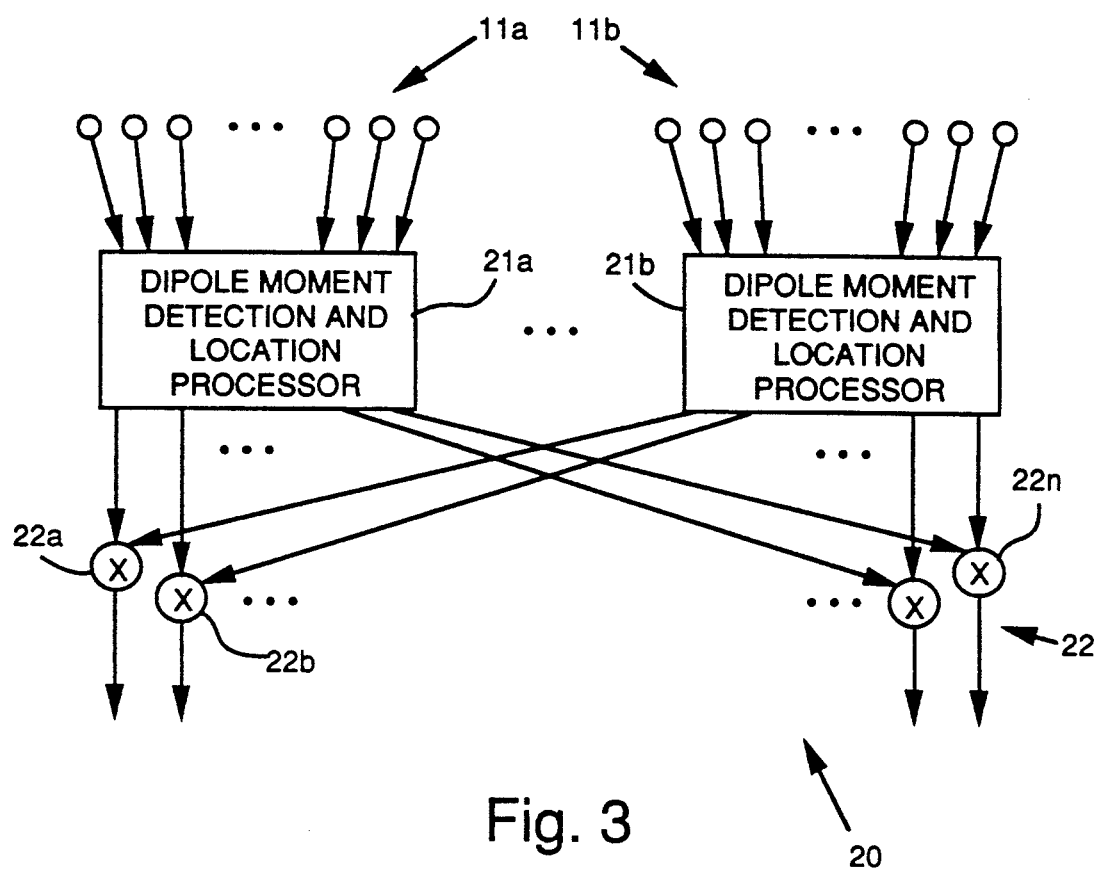
FIG. 3 illustrates the concept of split array dipole moment detection and location processing in accordance with the principles of the present invention.

FIG. 3 graphically illustrates the concept of the split array dipole moment detection and location processor 20 in accordance with the principles of the present invention. The processor 20 comprises a linear sensor array 11 that is divided up into plurality of subarrays 11a, 11b whose data is processed. Outputs of each sensor of the respective subarrays 11a, 11b are individually coupled to separate dipole moment detection and location processors 21a, 21b. However, it is to be understood that a single processor may be used to process the outputs of the subarrays 11a, 11b in parallel. The outputs of the respective dipole moment detection and location processors 21a, 21b are coupled to a combiner, or multiplier 22a-22n of an array of combiners, or multipliers 22 that are adapted to correlate the signals (dot product). The dipole moment detection and localization processing is applied twice, once to the output of each subarray 11a, 11b, thereby producing two separate sets of outputs. The dot product of these two outputs are then formed to yield data that is thresholded and displayed.

Figure 4:
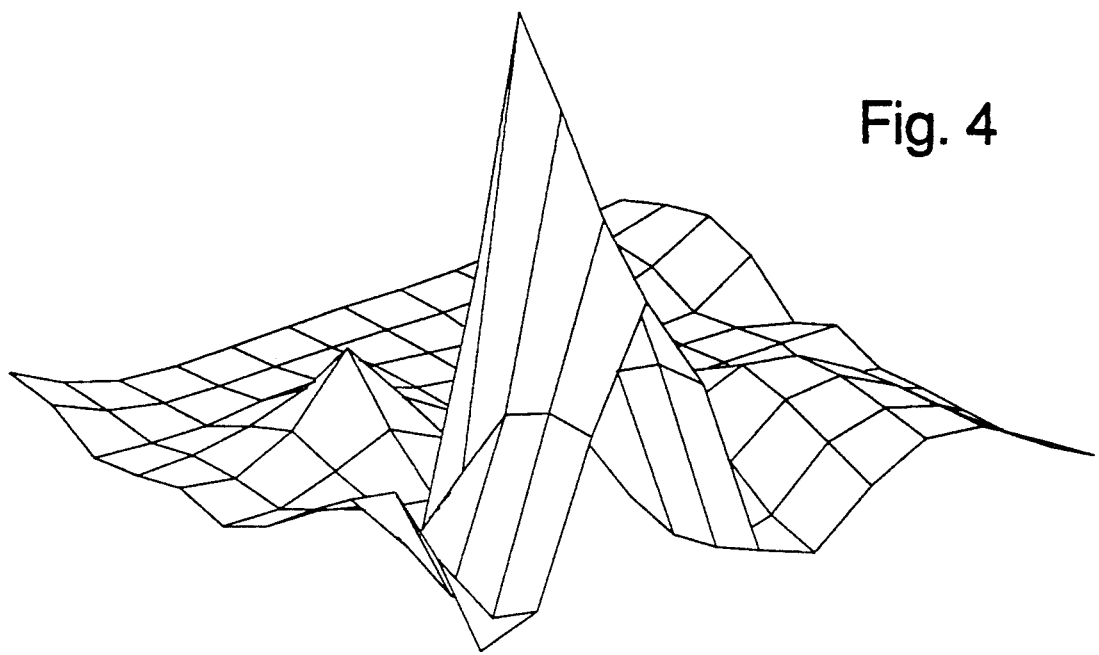
FIGS. 4 and 6 illustrate simulation data indicative of the output response of a prior art processing system.
Figure 5:
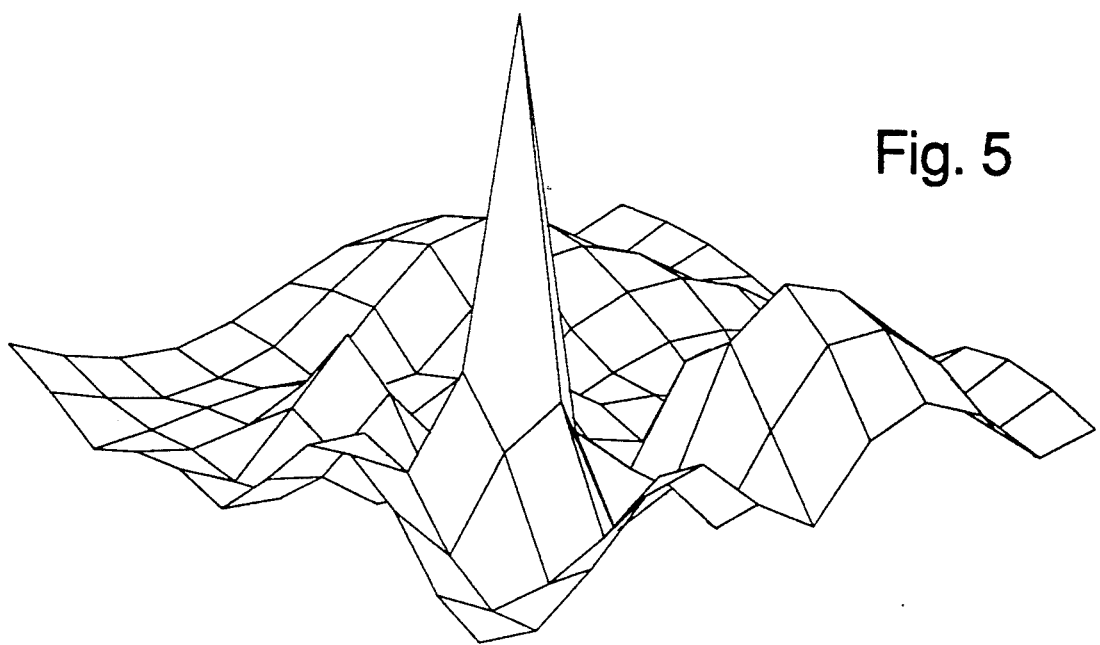
FIGS. 5 and 7 illustrate simulation data indicative of the output response of a processing system in accordance with the present invention.
Figure 6:
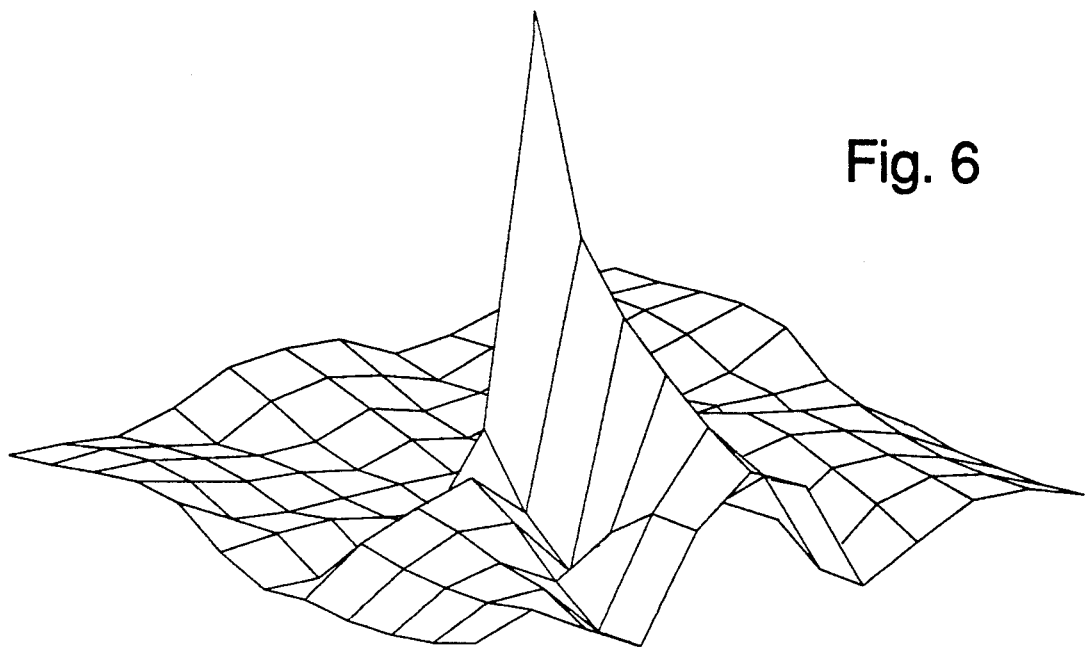
Figure 7:
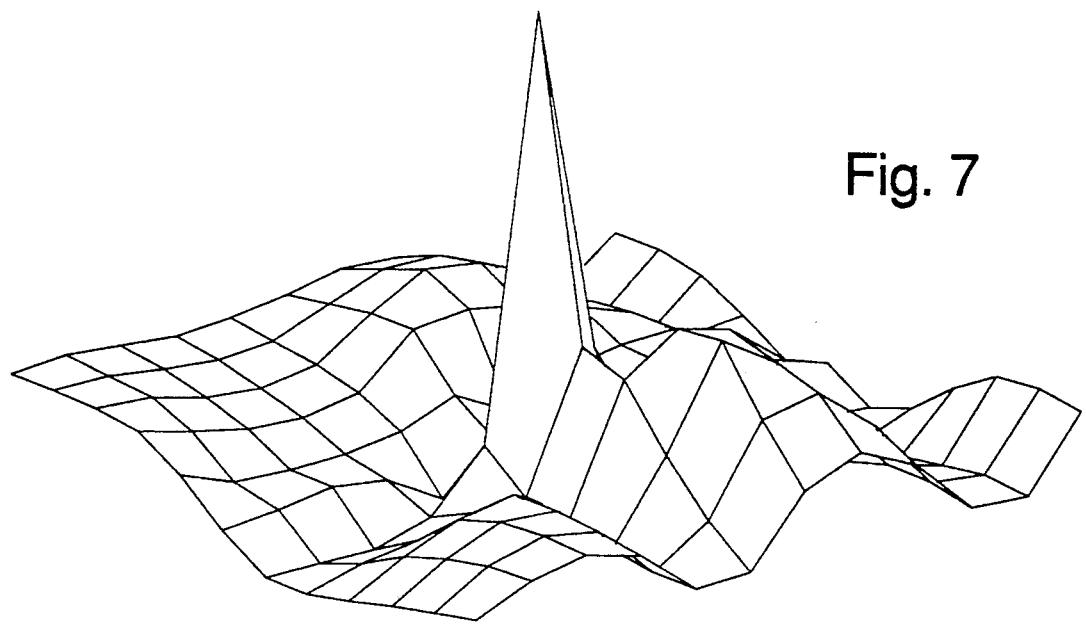

For the purpose of demonstrating the superior performance of the split array dipole moment detection and localization process of the present invention, simulations have been performed with representative results plotted in FIGS. 4–7. In FIGS. 4–7, outputs of a grid of maximum response locations are depicted by a three dimensional surface with the horizontal plane corresponding to the geometric positions of the maximum response locations, and the vertical axis corresponding to the magnitude responses of the maximum response locations. More particularly, FIGS. 4 and 6 illustrate simulation data indicative of the output response of a 100 sensor linear array having a grid of 12×12 maximum response locations that is made in accordance with the prior art processing system, while FIGS. 5 and 7 illustrate simulation data indicative of the output response of a 100 sensor split array having a grid of 12×12 maximum response locations that is made in accordance with the split array processing of the present invention. The plots shown in FIGS. 5 and 7 illustrate strong peaks at the dipole location.

Ideally, placement of a dipole 13 inside this maximum response location grid gives rise to a maximum response of a maximum response location output whose position is coincident with the dipole's location, and a zero or no response to all other maximum response locations. This, however, is not achievable in actual practice. The relative merit of the present invention is measured based on how close its performance approaches this ideal state. With this in mind, it can be observed by comparison, in FIGS. 5 and 7, that split array dipole moment detection and localization processing yields lower sidelobe levels than does the line array dipole moment detection and localization process of the above-referenced application shown in FIGS. 4 and 6.

The present invention comprises a system 10 for detecting and localizing a magnetic dipole 13. The apparatus comprises an array of magnetic sensors 11, and a display for displaying the location of the identified dipole 13. A plurality of processors 21 are respectively coupled between the array of magnetic sensors 11 and the display 42 that each provide a plurality of functions. The plurality of processor 21 each store an estimate of the magnetic field signature to be detected by a plurality of subarrays 11a, 11b using a set of predicted magnetic dipole orientations at each of a plurality of preselected locations to provide subarrays of estimate signals that are represented by a first set of Anderson functions, process magnetic field signals indicative of the magnetic field measured at each of the sensors 11 in the presence of the magnetic dipole 13 that is to be detected, remove spatial and temporal variations in the magnetic field measured at each of the sensors 11 by temporally and spatially smoothing the measured magnetic field signals, process the temporally and spatially smoothed magnetic field signals to produce a second set of Anderson functions representative of each of the magnetic field signals, correlate the first and second sets of Anderson functions to produce a set of correlated Anderson functions for each of the plurality of subarrays 11a, 11b. Another processor or portion of a processor 21 is provided to correlate the sets of correlated Anderson functions from each of the plurality of subarrays 11a, 11b to produce a single set of output signals for the system 10, identify the location of the dipole if one of the correlations has a significantly larger value than the others and if it is greater than a predetermined threshold, and provide the location of the dipole that corresponds to the location represented by the measured magnetic field signals that produced in the significantly larger value.

The system 10 for detecting and localizing a magnetic dipole 13 may also be characterized as including the following components: a plurality of subarrays 11a, 11b of spatially distributed magnetic sensors 11 for sensing a magnetic dipole 13 that each provide output signals that are indicative of the magnetic field sensed thereby, first processing means 21 for generating a plurality of magnetic signatures of the magnetic field produced by the magnetic dipole 13 which represents a magnetic response function of the dipole 13 by processing the output signals from each of the magnetic sensors 11 of the plurality of subarrays 11a, 11b of sensors to decompose the magnetic field into its magnetic field components, combining means 22 (38) for combining (correlating) the processed output signals from each of the plurality of subarrays 11a, 11b to produce a correlated output signal indicative of the magnetic signature of the dipole 13, and second processing means 39, 40, 41 coupled to the combining means 22 for processing the magnetic response function to extract predetermined features therefrom that are indicative of the location and relative orientation of the dipole 13.

The method of detecting and localizing a magnetic dipole in accordance with the present invention may be characterized in several ways. The method comprises the following steps. Precomputing 35 a normalized estimate of the magnetic field in terms of Anderson functions to be sensed by a plurality of subarrays of the array of sensors 11 using a set of predicted magnetic dipole orientations located at each of the plurality of preselected locations. Measuring the magnetic field at each of the sensors 11 in the presence of the magnetic dipole 13 that is to be detected to produce measured magnetic field signals. Removing 31, 32, 33 spatial and temporal variations in the magnetic field measured at each of the sensors 11 by temporally and spatially smoothing the measured magnetic field signals. Processing 34 the temporally and spatially smoothed measured magnetic field signals to produce a second set of Anderson function expansion coefficients representative of each of the measured magnetic field signals. Correlating 36 the first and second sets of Anderson function expansion coefficients to produce a response function for the magnetic dipole location for each of the plurality of subarrays of sensors 11a, 11b at each of the plurality of maximum response locations. Correlating 38 the respective response functions derived from processing each of the plurality of subarrays of sensors 11a, 11b. Identifying 39, 40, 41 the location of the dipole if one of the correlated response functions has a significantly larger value than the others, and if it is greater than a predetermined threshold, and the location of the dipole corresponds to the location represented by the measured magnetic field signals that produced in the significantly larger value.

Furthermore, the method of the present invention may also be characterized as comprising the following steps. Precomputing and storing 35 an estimate of the magnetic field derived from a plurality of arrays of sensors 11a, 11b, assuming that there is a magnetic dipole 13 located at each of a plurality of selected locations relative to the plurality of arrays of sensors 11a, 11b. Taking measurements of the magnetic field at each sensor of the plurality of arrays of sensors 11a, 11b in the presence of a magnetic dipole 13 within the field. Removing spatial and temporal variations 31, 32, 33 present in the measured magnetic field caused by the naturally occurring background. Correlating 36 the measured values with each of the precomputed and stored estimate values for each of the plurality of arrays of sensors 11a, 11b, by multiplying the calculated estimate values with the measured values. Combining 38 the correlated results for each of the plurality of arrays of sensors 11a, 11b to produce combined correlated values. Consequently, if one of the resulting combined correlated values has a significantly larger value than the others and if it is greater than a predetermined threshold 40, declaring a detection for the location corresponding to the combined correlated values which resulted in the larger combined correlated value.

Thus there has been described a new and improved dipole moment detection and localization apparatus and methods for detecting surface and subsurface vessels that incorporates split array processing. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. Apparatus for detecting and locating a magnetic dipole comprising:

an array of spatially distributed magnetic sensors that each provide output signals that are indicative of a respective magnetic field sensed thereby that correspond to a magnetic dipole;

processing means individually coupled to the array of spatially distributed magnetic sensors for separately processing data generated by a plurality of subarrays of sensors, and for generating a measured magnetic signature of the magnetic field produced by the presence of the magnetic dipole, and for providing output signals indicative of the magnetic signature;

combining means coupled to the processing means for combining the respective output signals of the plurality of subarrays of sensors to produce correlated output signals;

processing means for processing the correlated output signals to determine the location and relative orientation of the magnetic dipole; and means for displaying the location and relative orientation of the magnetic dipole.

2. Apparatus for detecting and locating a magnetic dipole comprising:

an array of magnetic sensors;

a plurality of processing means respectively coupled to the array of magnetic sensors, for storing an estimate of the magnetic field signature to be detected by a plurality of subarrays of the array of sensors using a known set of magnetic dipole orientations at each of a plurality of preselected locations to provide subarrays of estimate signals that are represented by a first set of Anderson functions, and for processing magnetic field signals indicative of the magnetic field measured at each of the sensors in the presence of the magnetic dipole that is to be detected, and for removing spatial and temporal variations in the magnetic field measured at each of the sensors by temporally and spatially smoothing the measured magnetic field signals, and for processing the temporally and spatially smoothed magnetic field signals to produce a second set of Anderson functions representative of each of the magnetic field signals, and for correlating the first and second sets of Anderson functions to produce a set of correlated Anderson functions for each of the plurality of subarrays, and for correlating the sets of correlated Anderson functions for each of the plurality of subarrays to produce a single set of output signals for the apparatus, and for identifying the location of the dipole if one of the correlations has a significantly larger value than the others, and if it is greater than a predetermined threshold, and the location of the dipole corresponds to the location represented by the measured magnetic field signals that produced in the significantly larger value; and display means for displaying the location of the identified dipole.

3. Apparatus for detecting and locating a magnetic dipole comprising:

a plurality of subarrays of spatially distributed magnetic sensors for sensing a magnetic dipole that each provide output signals that are indicative of the magnetic field sensed thereby;

first processing means for generating a plurality of magnetic signatures of the magnetic field produced by the magnetic dipole which represents a magnetic response function of the dipole processing the output signals from each of the magnetic sensors of the plurality of subarrays of sensors to decompose the magnetic field into is magnetic field components;

combining means for combining the processed output signals from each of the plurality of subarrays of sensors to produce a correlated output signal indicative of the magnetic signature of the dipole;

second processing means coupled to the second combining means for processing the magnetic response function to extract predetermined features therefrom that are indicative of the location and relative orientation of the dipole; and means for displaying the location of the dipole.

4. A method of detecting and locating a magnetic dipole, said method comprising the steps of:

sensing a magnetic dipole using an array of spatially distributed magnetic sensors and providing output signals from each of the sensors that are indicative of the magnetic field sensed thereby;

individually processing output signals from a plurality of subarrays of the magnetic sensors to decompose the magnetic field sensed thereby into its magnetic field components to generate respective magnetic signatures produced by the magnetic field and the dipole which represents magnetic response functions of the dipole;

combining the magnetic signatures produced by processing the respective output from each of the respective subarrays to produce a correlated output signal;

processing the correlated output signals to provide signals that are indicative of the location and relative orientation of the dipole; and displaying the location and relative orientation of said dipole.

5. A method of detecting and locating a magnetic dipole comprising the steps of:

precomputing a normalized estimate of the magnetic field in terms of Anderson functions to be sensed by a plurality of subarrays of an array of sensors using a set of predicted magnetic dipole orientations located at each of a plurality of preselected locations;

measuring the magnetic field at each of the sensors of the arrays of sensors in the presence of the magnetic dipole that is to be detected to produce measured magnetic field signals;

removing spatial and temporal variations in the magnetic field measured magnetic field signals;

processing the temporally and spatially smoothed measured magnetic field signals to produce a second set of Anderson function expansion coefficients representative of each of the measured magnetic field signals;

correlating the first and second sets of Anderson function expansion coefficients to produce a response function for the magnetic dipole location for each of the plurality of subarrays of sensors at each of the plurality of maximum response locations;

correlating the respective response functions derived from processing of each of the plurality of subarrays of sensors;

identifying the location of the dipole if one of the correlated response functions has a significantly larger value than the others, and if it is greater than a predetermined threshold, and the location of the dipole corresponds to the location represented by the measured magnetic field signals that produced in the significantly larger value; and providing a visual display of said location.

6. A method of detecting and locating a magnetic dipole, said method comprising the steps of:

precomputing and storing and estimate of the magnetic field derived from a plurality of arrays of sensors, assuming that there is a magnetic dipole located at each of a plurality of selected locations relative to the plurality of arrays of sensors;

taking measurements of the magnetic field at each sensor of the plurality of arrays of sensors in the presence of magnetic dipole within the field;

removing spatial and temporal variations present in the measured magnetic field caused by the naturally occurring background;

correlating the measured values with each of the precomputed and stored estimates for each of the plurality of arrays of sensors, by multiplying the calculated estimate values with the measured values;

combining the correlated results for each of the plurality of arrays of sensors to produce combined correlated values;

whereby if one of the resulting combined correlated values has a significantly larger value than the others and if it is greater than a predetermined threshold, declaring a detection for the location corresponding to the combined correlated values which resulted in the larger combined correlated value; and displaying the location of said detection to an operator.

* * * * *